United States Patent [19]

Elle et al.

[11] Patent Number: 5,103,462
[45] Date of Patent: Apr. 7, 1992

[54] ARRANGEMENT FOR THE CONVERSION OF AN ELECTRICAL INPUT QUANTITY INTO A DC SIGNAL PROPORTIONAL THERETO

[75] Inventors: André Elle, Rümmingen; Günter Lange, Villingen, both of Fed. Rep. of Germany

[73] Assignee: Endress u. Hauser GmbH u. Co., Fed. Rep. of Germany

[21] Appl. No.: 591,696

[22] Filed: Oct. 2, 1990

[30] Foreign Application Priority Data

Oct. 6, 1989 [DE] Fed. Rep. of Germany ....... 3933491

[51] Int. Cl.⁵ .............................................. H03K 7/08
[52] U.S. Cl. ........................................ 375/22; 341/155
[58] Field of Search ............... 375/22, 23, 25, 26; 341/200, 118, 155; 332/109; 370/9; 307/265

[56] References Cited

U.S. PATENT DOCUMENTS

| | | | |
|---|---|---|---|
| 4,112,368 | 9/1978 | Ewanus et al. | 375/22 |
| 4,179,660 | 12/1979 | Zeis | 375/22 |
| 4,334,237 | 6/1982 | Reitmeier et al. | 375/26 |
| 4,540,973 | 9/1985 | Grallert | 375/25 |
| 4,815,078 | 3/1989 | Shimura | 375/26 |

OTHER PUBLICATIONS

"Electronic Analog-to-Digital Converters", by Seitzer, Pretzl and Hamdy, John Wiley & Sons, 1983, pp. 34–38, 49, 50, 53, 61–63, 170, 171.

*Primary Examiner*—Stephen Chin
*Attorney, Agent, or Firm*—Barnes & Thornburg

[57] ABSTRACT

The arrangement for the conversion of an electrical input quantity into an electrical DC signal proportional thereto comprises two digital pulse duration modulators of limited resolution. The first digital pulse duration modulator supplies a first periodic pulse sequence which is pulse duration modulated with a quantization value, corresponding to the limited resolution, of the input quantity neglecting the quantization remainder. The second digital pulse duration modulator supplies a second periodic pulse sequence which is pulse duration modulated with the sum of the quantization value and of the quantization remainder multiplied by a predetermined factor. A system is provided for selectively transmitting pulses of the first and second pulse sequences to an averaging circuit in such a manner that the raito of the number of transmitted pulses of the second pulse sequence to the total number of transmitted pulses is equal to the reciprocal of the predetermined factor. The averaging circuit forms the DC signal means value of the combined sequence of transmitted pulses, whereby the resolution is enhanced with respect to the limited resolution of the digital pulse duration modulators.

4 Claims, 2 Drawing Sheets

ARRANGEMENT FOR THE CONVERSION OF AN ELECTRICAL INPUT QUANTITY INTO A DC SIGNAL PROPORTIONAL THERETO

BACKGROUND AND SUMMARY OF THE INVENTION

The invention relates to an arrangement for the conversion of an electrical input quantity into an electrical DC signal proportional thereto, comprising a digital pulse duration modulator having a limited resolution, which provides a periodic pulse sequence which is pulse duration modulated with the quantization value, corresponding to the limited resolution, of the input quantity neglecting the quantization remainder, and an averaging circuit for forming the DC signal mean value of the pulse duration modulated pulses.

In arrangements of this type the accuracy with which the electrical input quantity is converted into the DC signal proportional thereto, is limited to the accuracy corresponding to the resolution of the digital pulse duration modulator.

If for instance a commercially available 8 bit pulse duration modulator is used, the total value range of the input quantity may only be converted into $2^8 = 256$ quantization values and accordingly the DC signal may only assume respectively one of the 256 values proportional thereto. Intermediate values of the input quantity, which correspond to a quantization remainder differing from zero, are represented by the next lower value of the DC signal. The accuracy obtainable in this manner is insufficient for many applications.

One object of the present invention is to provide an arrangement of the before-mentioned type which, while adhering to the principle of conversion by digital pulse duration modulation with a limited resolution, leads to enhanced accuracy.

In order to achieve this object the arrangement in accordance with the invention comprises a first pulse duration modulator of a limited resolution which supplies a first periodic pulse sequence which is pulse duration modulated with a quantization value, corresponding to the limited resolution, of the input quantity neglecting the quantization remainder, a second digital pulse duration modulator of limited resolution which supplies a second periodic pulse sequence which is pulse duration modulated with the sum of said quantization value and of the quantization remainder multiplied by a predetermined factor, means for forming a combined periodic pulse sequence by selectively transmitting pulses of said first and second periodic pulse sequences in such a manner that the ratio of the number of transmitted pulses of said second periodic pulse sequence to the total number of transmitted pulses in said combined periodic pulse sequence is equal to the reciprocal of said predetermined factor, and an averaging circuit which receives said combined periodic pulse sequence and forms the DC signal mean value thereof.

The enhancement of the accuracy obtained in accordance with the invention is due firstly to the fact that the quantization remainder, which remains out of consideration during the first pulse duration modulation, is transformed by the multiplication with the predetermined factor to a value which can be used with the limited resolution for the pulse duration modulation, and secondly that this enhanced value is then distributed by the pulse selection on average to a number, corresponding to the factor, of pulse periods so that for each pulse period there is a fraction which corresponds to the real quantization remainder. The enhancement of the accuracy corresponds to the resolution with which the multiplied quantization remainder is expressed. If for instance the quantization remainder is represented with a resolution of 3 bits, there will be an enhancement of accuracy by a factor of $2^3 = 8$, and the conversion obtained with two 8 bit pulse duration modulators will be equivalent to a conversion obtained with an 11 bit pulse duration modulator.

BRIEF DESCRIPTION OF THE DRAWINGS

Further details and advantages of the invention will be apparent from the following description of an embodiment thereof referring to the drawings, wherein.

DETAILED DESCRIPTION OF THE DRAWINGS

Figure 1:
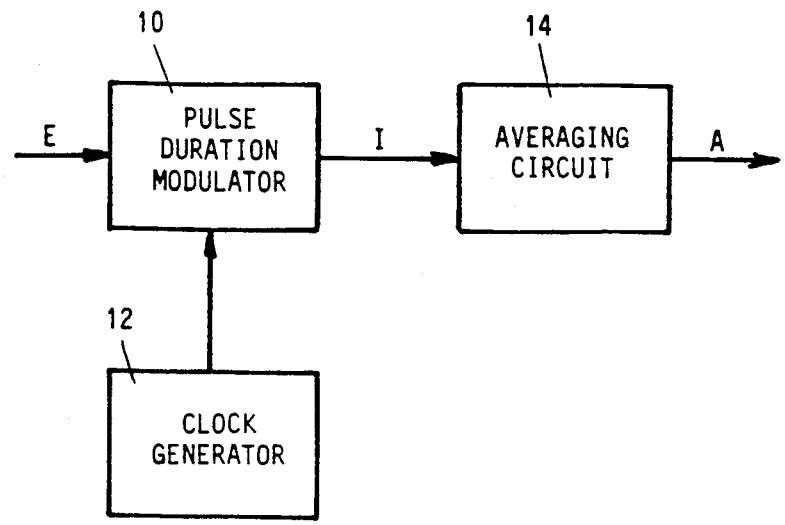
FIG. 1 is a diagram of the principle employed by the invention of the conversion of an input quantity into a DC signal proportional thereto by digital pulse duration modulation.

FIG. 1 diagrammatically shows the principle employed in the present invention of conversion of an electrical input quantity E into an analog signal A which is formed by an electrical DC signal proportional to the input quantity. The term "DC signal" is used herein to mean a direct current or a direct voltage signal. The input quantity E is supplied as a modulation signal to a pulse duration modulator 10 which at its output produces a pulse sequence I whose pulses occur consecutively with a constant period and have a duration which is proportional to the value of the input quantity E. Accordingly the duty factor of the pulses, that is to say the ratio between the pulse duration and the period duration, is proportional to the input quantity E. The repetition frequency of the pulse sequence I is for instance determined by a clock signal supplied by a clock generator 12. The pulse duration modulated pulse sequence I is fed to an averaging circuit 14, which at its output provides a signal which corresponds to the DC signal mean value, i.e. the DC current mean value or the DC voltage mean value, of the pulse duration modulated pulses. The averaging circuit 14 may for instance be constituted by a low pass filter. The DC signal mean value received by the averaging circuit 14 is proportional to the duty factor of the pulse duration modulated pulse sequence I and since this duty factor is proportional to the value of the input quantity E, the DC signal mean value is proportional to the value of the input quantity E. The DC signal mean value thus constitutes the desired output signal A.

The accuracy with which the input quantity E is converted into the DC signal A proportional thereto depends on the resolving power of the pulse duration modulator 10. If it is for instance in the form of a commercially available digital pulse duration modulator with a comparatively poor resolution of 8 bits, the pulse duration of the pulse duration modulated pulse sequence I may vary over the entire pulse period in only $2^8 = 256$ steps and accordingly the DC signal mean value may only assume 256 different values. The intermediate values of the input quantity E are expressed by the respectively next lower step of the output signal A. The accuracy of conversion then possible is insufficient for many applications.

Figure 2:
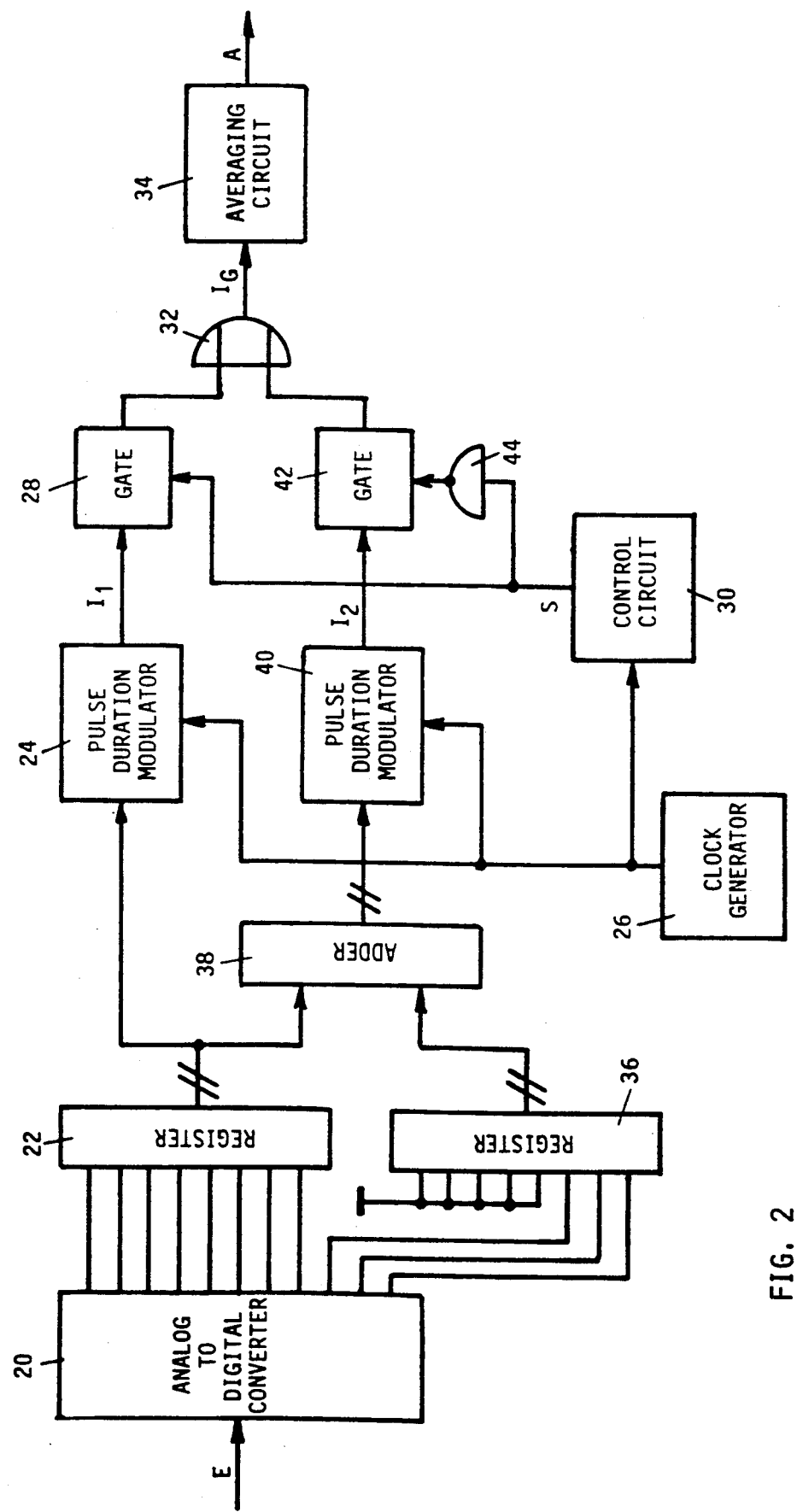
FIG. 2 is a block circuit diagram of an embodiment of the arrangement in accordance with the invention, FIG. 3 are graphs of signals which are produced in the arrangement of FIG. 2.

FIG. 2 shows a conversion circuit which while still adhering to the principle of pulse duration modulation performed with limited resolution leads to a conversion with a substantially improved accuracy.

In FIG. 2 it is assumed that the input quantity E is an analog quantity. The analog input quantity E is fed to an analog to digital converter 20 with the comparatively high resolution of 11 bits. The analog to digital converter 20 is capable of converting the entire value range of the analog input quantity E into $2^{11} = 2048$ values, each of which corresponds to one quantization step of the analog input quantity E. The analog to digital converter 20 produces an eleven-digit binary code group at eleven outputs, such group expressing the quantized value of the analog input quantity as a dual number. In the drawing the lowermost output of the analog to digital converter 20 is associated with the dual digit having the lowest significance and the uppermost output is associated with the dual digit having the highest significance.

The eight outputs of the highest significances are connected with the inputs of an eight stage register 22, which is thus supplied with a binary code group which consists of the eight binary digits of the highest significance of the binary code group supplied by the analog to digital converter 20. The binary code group contained in the register 22 constitutes an eight-digit dual number whose numerical value is obtained from the numerical value, divided by $2^3 = 8$, of the eleven-digit dual number supplied by the analog to digital converter 20 neglecting the remainder of division. If for instance the eleven-digit dual number supplied by the analog to digital converter 20 has the decimal numerical value 717, the decimal numerical value of the eight-digit dual number contained in the register 22 will correspond to the integral part of the quotient of the division $$717:8 = 89.625,$$

that is to say the decimal value 89 while the remainder (0.625) of division is neglected. This may be seen directly from the following comparison of the corresponding dual numbers:

| A/D converter 20: | 0 1 0 1 1 0 0 1 1 0 0 = 717 |
|---|---|
| Register 22: | 0 1 0 1 1 0 0 1 = 89 |

The remainder of division not taken into account results from the binary digits at the three outputs associated with the lowest significances of the analog to digital converter 20, which are not connected with the register 22.

Therefore, in the register 22 the entire value range of the analog input quantity E can only be expressed by $2^8 = 256$ digital values, which each respectively correspond to a quantization value with the limited resolution of 8 bits, and the digital numerical value, contained in each case in the register 22, corresponds to one of these 256 quantization values neglecting the quantization remainder.

The outputs of the register 22 are connected with the modulation signal inputs of a digital pulse duration modulator 24 which has the same resolution of 8 bits as the register 22. The pulse duration modulator 24 corresponds to the pulse duration modulator 10 of FIG. 1 and at its output it produces a pulse duration modulated pulse sequence $I_1$, whose pulse period is determined by a clock signal provided by a clock generator 26 and whose pulses have a duration that is proportional to the digital numerical value contained in the register 22. The output of the pulse duration modulator 24 is connected with the signal input of a gate circuit 28, whose control input is connected with the output of a control circuit 30 synchronized with the clock generator 26 so that the gate circuit 28 is turned on or off by the control signal S supplied by the control circuit 30. The output of the gate circuit 28 is connected via an OR gate 32 with an averaging circuit 34, which corresponds to the averaging circuit 14 in FIG. 1 and may for instance be in the form of a low pass filter. When the gate 28 is turned on by the control circuit 30, the pulse duration modulated pulse sequence $I_1$ is thus fed to the averaging circuit 34. The components so far described of the circuit of FIG. 2 operate then in the same manner as in the circuit of FIG. 1 previously described.

The other components of the circuit of FIG. 2 serve to enhance the accuracy with which the analog input quantity E is converted into the DC signal A provided at the output. To this end a second eight stage register 36 is provided, whose three inputs associated with the lowest significances are connected with the three outputs associated with the lowest significances, of the analog to digital converter 20, whereas the other inputs of the register 36 are not connected. Therefore, an eight-digit dual number is contained in the register 36, the first five digits of this number having the value of zero while the last three digits have the binary values of the last three digits of the eleven-digit dual number which is produced by the analog to digital converter 20.

The outputs of the register 36 are connected with an associated group of inputs of an adder 38, whose second input group is connected with the outputs of the register 22. The adder 38 forms the sum of the two eight-digit dual numbers which are contained in the registers 22 and 36 and produces an eight-digit dual number, corresponding to this sum, at its outputs.

The outputs of the adder 38 are connected with the modulation signal inputs of a digital pulse duration modulator 40, which is of the same type as the pulse duration modulator 24, that is to say has the same limited resolution of 8 bits. The pulse duration modulator 40 also receives the clock signal produced by the clock generator 26 and at the output it provides a pulse duration modulated pulse sequence $I_2$, whose pulses have the same constant period determined by the clock generator 26 as the pulses of the pulse sequence $I_1$ and whose pulse duration is proportional to the numerical value of the dual number provided by the adder 38. The output of the pulse duration modulator 40 is connected with the signal input of a gate 42, which at its control input receives the control signal S, supplied by the control circuit 30, via an inverter 44 so that the gate is turned on and off in antiphase with the operation of the gate 28. The output of the gate 42 is connected via the OR gate 32 with the averaging circuit 34.

The addition in the adder 38 means that the binary values of the last three digits of the dual number contained in the register 36 are added with the same respective significance to the binary values of the three last digits of the dual number contained in the register 22. Thus, in the numerical example previously given there is an addition in accordance with the following scheme:

| Register 22: | 0 | 1 | 0 | 1 | 1 | 0 | 0 | 1 | = | 89 |
|---|---|---|---|---|---|---|---|---|---|---|
| Register 36: | 0 | 0 | 0 | 0 | 0 | 1 | 0 | 1 | = | 5 |
| Register 38: | 0 | 1 | 0 | 1 | 1 | 1 | 1 | 0 | = | 94 |

For the addition the last three digits of the dual number contained in the register 36 are therefore displaced by three digits in the higher significance direction, this meaning that there is a multiplication by the factor $2^3 = 8$. These three digits correspond to the division remainder, which is not taken into account in the pulse duration modulator 24. In the above numerical example the remainder has the decimal value of 0.625; it is taken into account in the addition with the decimal value of $0.625 \cdot 8 = 5$.

Related to the value of the analog input quantity E the dual number contained in the register 22 corresponds, as already explained, to a quantization value of the input quantity E with the resolution limited to 8 bits, the quantization remainder being left out of consideration. The quantization remainder is only zero if the value of the input quantity E happens to be exactly equal to the quantization value. If the quantization remainder is not zero, the pulse duration of the pulse duration modulated pulse sequence $I_1$ will be smaller than the pulse duration which would correspond to the exact value of the input quantity E by an amount proportional to the quantization remainder.

On the other hand the dual number produced by the adder 38 is equal to the sum of the quantization value taken into account in the pulse duration modulator 24 and the quantization remainder multiplied by the factor 8, this sum also being represented with a resolution of 8 bits. If the quantization remainder is not equal to zero, the pulse duration of the pulse duration modulated pulse sequence $I_2$ is greater than pulse duration which would correspond to the exact value of the input quantity by an amount equal to seven times the quantization remainder.

Figure 3:
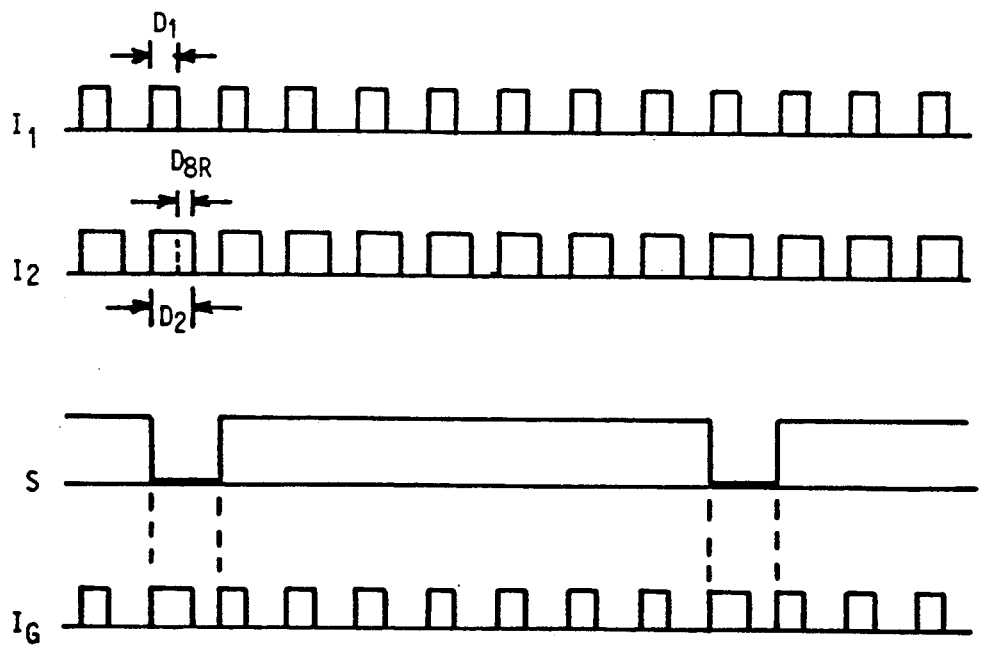

In order to provide for a better understanding of the manner of operation the pulse sequences $I_1$ and $I_2$ are represented in the graphs of FIG. 3 with the same connotations. Further graphs of FIG. 3 show the variation with time of the control signal S supplied from the control circuit 30 and the combined pulse sequence $I_G$ appearing at the output of the OR gate 32.

When the control signal S has the high signal level the gate 28 is turned on and the gate 42 is turned off. When the control signal S has the low signal level the gate 42 is turned on and the gate circuit 28 is turned off.

The control circuit 30 is so designed that the control signal S has the high signal level for seven consecutive pulse periods of the pulse sequences $I_1$ and $I_2$ and then has the low signal level for one pulse period. Thus in eight consecutive pulses the combined pulse sequence $I_G$ transferred to the averaging circuit 34 has seven pulses of the pulse sequence $I_1$ and one pulse of the pulse sequence $I_2$.

Since the duration $D_2$ of the pulses of the pulse sequence $I_2$ is equal to the sum of the pulse duration $D_1$ of the pulse sequence $I_1$ added to the duration $D_{8R}$ corresponding to 8 times the quantization remainder, i.e.:

$$D_2 = D_1 + D_{8R}$$

eight consecutive pulses of the combined pulse sequence $I_G$ will have the overall duration of:

$$7 \cdot D_1 + D_2 = 8 \cdot D_1 + D_{8R}.$$

This corresponds to a mean pulse duration $D_M$:

$$D_M = (8 \cdot D_1 + D_{8R})/8 = D_1 + D_{8R}/8.$$

The DC signal mean value formed by the averaging circuit 34 is proportional to this mean pulse duration $D_M$.

The term $D_{8R}/8$ corresponds to a fraction, which is proportional to the simple quantization remainder, of the pulse duration. The mean pulse duration is thus made up of a fraction proportional to the quantization value and a fraction proportional to the quantization remainder. It is thus proportional to the value of the input quantity E with a degree of accuracy which is higher due to taking the quantization remainder into account. Since in the selected example the quantization remainder is taken into account with a resolution of 3 bits, there is an increase in accuracy by a factor of $2^3 = 8$. This enhanced accuracy is maintained in the DC signal mean value formed by the averaging circuit 34.

The previously mentioned measures taken to increase the accuracy thus reside, in a general case, in using for the pulse duration modulation of the second pulse sequence the sum of the quantization value used for the modulation of the first pulse sequence and of the quantization remainder times a factor n, and in using for the averaging a pulse sequence which is so made up of pulses of the two pulse sequences that respectively n consecutive pulses contain one pulse of the second pulse sequence and (n−1) pulses of the first pulse sequence. Then the n-fold quantization remainder additionally contained in the one pulse of the second pulse sequence is divided on average among n pulse periods.

All in all in the combined pulse sequence used for the averaging, the ratio of the number of pulses of the second pulse sequence to the overall number of the pulses has to be equal to the reciprocal of the factor by which the quantization remainder is multiplied.

Thus, by simple circuit modifications, which are restricted to the use of 8 bit circuits, it becomes possible to achieve a substantial increase in the accuracy of conversion of an input quantity into the DC signal proportional thereto, beyond the accuracy corresponding to 8 bit resolution. The system described is particularly advantageous owing to the fact that IC's are commercially available which contain two 8 bit pulse duration modulators. Therefore it is possible to employ the second pulse duration modulator present to increase the accuracy.

The invention is obviously not limited to a case in which the input quantity is an analog signal, as is assumed in the above description. The input quantity may be in the form of any electrical signal, as for instance a digital signal, a frequency or the like. If for instance the input quantity is in the form of a parallel binary code group, the analog to digital converter 20 in FIG. 2 may be replaced by a register in which the code group is stored, or the parallel conducting lines, via which the code group is transferred, may be directly connected with the inputs of the registers 22 and 36. The modifications in the circuit needed in this case will be familiar to those having ordinary skill in the art.

We claim:

1. An arrangement for the conversion of an electrical input quantity into an electrical DC signal proportional thereto, comprising a first digital pulse duration modulator of limited resolution which supplies a first periodic pulse sequence which is pulse duration modulated with a quantization value, corresponding to the limited resolution of the input quantity neglecting the quantization remainder, means for providing a sum of said quantization value and of a quantization remainder multiplied by a predetermined factor, a second digital pulse duration modulator of limited resolution which supplies a second periodic pulse sequence which is pulse duration modulated with the sum of said quantization value and of the quantization remainder multiplied by a predetermined factor, means for forming a combined periodic pulse sequency by selectively transmitting pulses of said first and second periodic pulse sequences in such a manner that the ratio of the number of transmitted pulses of said second periodic pulse sequence to the total number of transmitted pulses in said combined periodic pulse sequence is equal to the reciprocal of said predetermined factor, and an averaging circuit which receives said combined periodic pulse sequence and forms the DC signal mean value thereof.

2. An arrangement as claimed in claim 1, comprising an analog to digital converter for converting an analog electrical input quantity into a digital quantity with a resolution which is greater than the limited resolution of said pulse duration modulators and means for supplying the digital quantity to the first and second pulse duration modulators.

3. An arrangement as claimed in claim 1, comprising a digital adder which receives at a first group of inputs a digital number corresponding to said quantization value corresponding to the limited resolution and at a second group of inputs a digital number corresponding to the quantization remainder multiplied by said predetermined factor, which adder supplies at its output a digital number corresponding to the sum of the two digital input numbers to said second pulse duration modulator.

4. An arrangement as claimed in claim 1, wherein said means for forming said combined periodic pulse sequence comprises a first gate circuit connected to the output of said first pulse duration modulator, a second gate circuit connected to the output of said second pulse duration modulator, a control circuit for selectively opening and closing said first and second gate circuits in antiphase, and an OR gate which receives the output signals of said first and second gate circuits.

* * * * *